United States Patent
Hiroi et al.

(10) Patent No.: US 7,728,294 B2
(45) Date of Patent: Jun. 1, 2010

(54) SEMICONDUCTOR WAFER INSPECTION TOOL AND SEMICONDUCTOR WAFER INSPECTION METHOD

(75) Inventors: Takashi Hiroi, Yokohama (JP); Kenji Tanimoto, Hitachinaka (JP); Yuko Sasaki, Mito (JP); Hiroshi Makino, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 271 days.

(21) Appl. No.: 11/808,247

(22) Filed: Jun. 7, 2007

(65) Prior Publication Data

US 2008/0067381 A1    Mar. 20, 2008

(30) Foreign Application Priority Data

Jun. 8, 2006   (JP) .............................. 2006-160006

(51) Int. Cl.
*H01J 37/21* (2006.01)
*H01J 37/26* (2006.01)

(52) U.S. Cl. ....................... 250/310; 250/306; 250/307; 250/311

(58) Field of Classification Search ................. 250/306, 250/307, 309, 310, 311; 850/5, 8, 9, 10, 850/11, 26; 430/296, 297, 298; 324/500, 324/537, 750, 751, 501, 534
See application file for complete search history.

(56) References Cited

U.S. PATENT DOCUMENTS 6,172,365 B1    1/2001  Hiroi et al.
6,504,393 B1    1/2003  Lo et al.
6,700,122 B2 *  3/2004  Matsui et al. ................ 250/310
2002/0028399 A1* 3/2002  Nakasuji et al. ............... 430/30
2003/0201391 A1* 10/2003 Shinada et al. .............. 250/307
2003/0206027 A1* 11/2003 Nozoe et al. ................ 324/751
2005/0218325 A1* 10/2005 Nishiyama et al. .......... 250/311
2006/0016990 A1* 1/2006  Suzuki et al. ............... 250/310
2006/0186337 A1* 8/2006  Hatano et al. ............... 250/310
2007/0023658 A1* 2/2007  Nozoe et al. ................ 250/310

FOREIGN PATENT DOCUMENTS

JP     9-320505 A    12/1997
JP    11-121561 A     4/1999
JP    11-160247 A     6/1999

* cited by examiner

*Primary Examiner*—Jack I Berman
*Assistant Examiner*—Nicole Ippolito Rausch
(74) *Attorney, Agent, or Firm*—Crowell & Moring LLP (57) ABSTRACT

A semiconductor wafer inspection tool and a semiconductor wafer inspection method capable of conducting an inspection under appropriate conditions in any one of an NVC (Negative Voltage Contrast) mode and a PVC (Positive Voltage Contrast) mode is provided. Primary electrons 2 are irradiated onto a wafer to be inspected 6 and the irradiation position thereof is scanned in an XY direction. Secondary electrons (or reflected electrons) 10 from the wafer to be inspected 6 are controlled by a charge control electrode 5 and detected by a sensor 11. An image processor converts a detection signal from the sensor 11 to a detected image, compares the detected image with a predetermined reference image, judges defects, an overall control section 14 selects inspection conditions from recipe information for each wafer to be inspected 6 and sets a voltage to be applied to the charge control electrode 5. A Z stage 8 sets the distance between the wafer to be inspected 6 and the charge control electrode 5 according to this voltage.

12 Claims, 8 Drawing Sheets

SEMICONDUCTOR WAFER INSPECTION TOOL AND SEMICONDUCTOR WAFER INSPECTION METHOD

BACKGROUND OF THE INVENTION

1. Field of the Invention

The present invention relates to a semiconductor wafer inspection tool and a semiconductor wafer inspection method for inspecting a substrate apparatus which has a circuit pattern such as a semiconductor apparatus and liquid crystal using electron beams.

2. Background Art

Conventionally, an electron beam based pattern inspection tool is known which irradiates electron beams onto a wafer to be inspected, detects secondary electrons generated and scans electron beams, thereby obtains a secondary electron image of the circuit pattern on the wafer, compares the detected image with a reference image which must have an identical pattern and judges locations where there is a large difference as defects (e.g., see JP Patent Publication (Kokai) No. 1'-160247A (1999)).

The material and construction forming a circuit pattern to be inspected by an inspection tool are becoming increasingly complicated and defects are also becoming more diversified accordingly. The conventional inspection tools create various detection conditions by appropriately setting an acceleration voltage which represents energy of electron beams on a wafer and electric field intensity or the like on the object.

As will be described more specifically later, as for electron optical systems in particular, there are modes of setting the electron optical systems called an "NVC" (Negative Voltage Contrast) mode and a "PVC" (Positive Voltage Contrast) mode. Since the NVC mode and the PVC mode have substantially different types of detectable defects, there is a demand for an apparatus which can singly make inspection performance in these two modes compatible with each other. On the other hand, however, an optimal configuration of an electron optical system to realize these two modes varies greatly and it is difficult for a single optical system to realize the optimal configuration for both conditions.

The present invention has been implemented in view of such circumstances and it is an object of the present invention to provide a semiconductor wafer inspection tool and a semiconductor wafer inspection method capable of performing inspections under appropriate conditions in any mode of the NVC mode and the PVC mode.

SUMMARY OF THE INVENTION

The semiconductor wafer inspection tool and the semiconductor wafer inspection method according to the present invention selects recipe information indicating an inspection condition for each object and sets a distance between the object and a charge control electrode according to a voltage applied to the charge control electrode, and specific means thereof will be explained in detail using embodiments which will be described later.

According to the present invention, it is possible to provide a semiconductor wafer inspection tool and a semiconductor wafer inspection method capable of performing inspections under an appropriate condition in any mode whether NVC mode or PVC mode.

DETAILED DESCRIPTION OF THE PREFERRED EMBODIMENTS

Next, embodiments of the present invention will be explained in detail with reference to the attached drawings.

Figure 1:
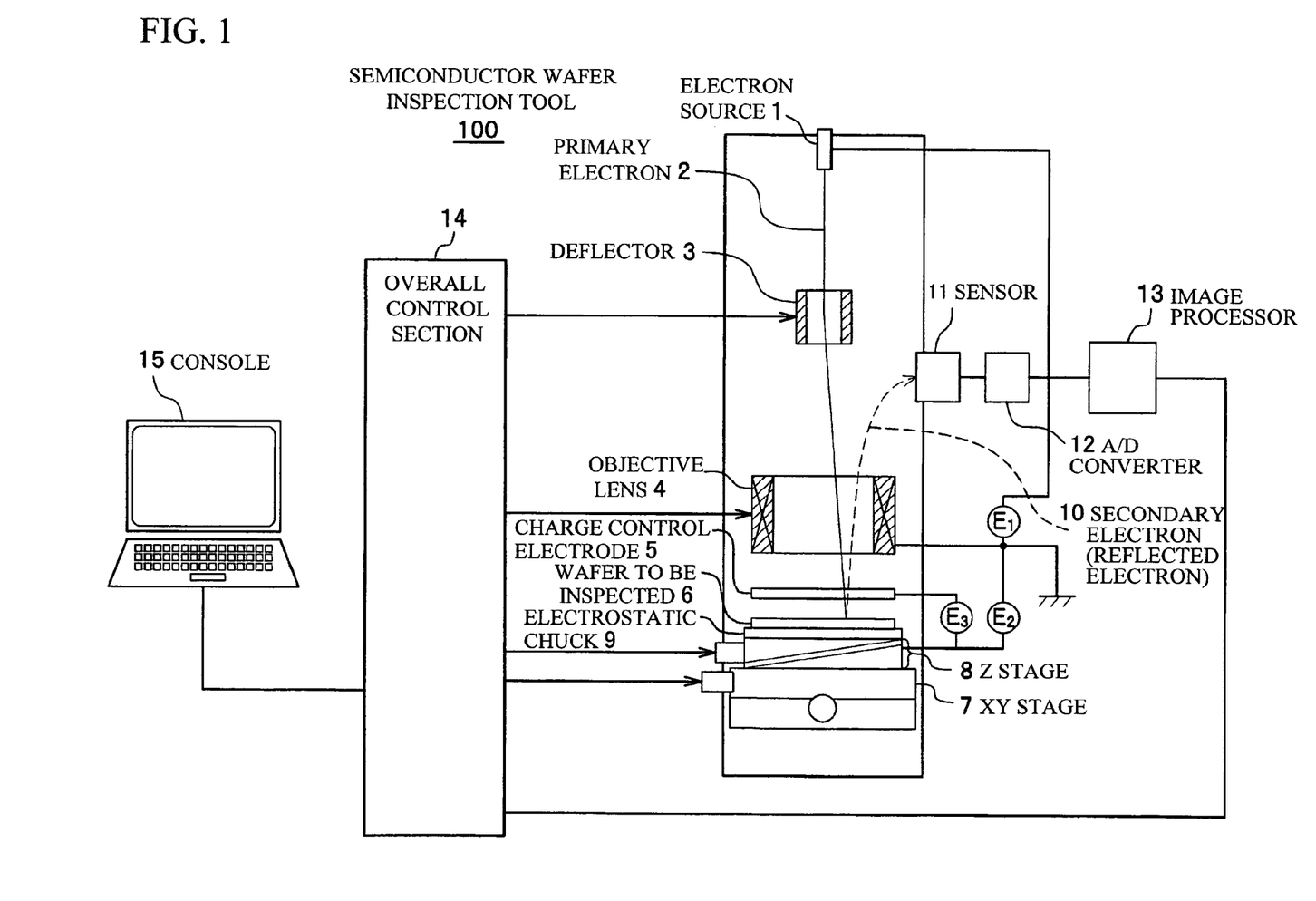
FIG. 1 is a configuration diagram of a semiconductor wafer inspection tool illustrating means for solving problems according to the present invention.

FIG. 1 is a configuration diagram showing a semiconductor wafer inspection tool 100 in a basic form.

This semiconductor wafer inspection tool 100 is provided with an electron source 1, a deflector 3 for deflecting primary electrons 2 from the electron source 1, an objective lens 4 which narrows down the primary electrons 2, a charge control electrode 5 which controls electric field intensity, an XY stage 7 which moves a wafer to be inspected 6 in an XY direction, a Z stage 8 which moves the wafer to be inspected 6 in a Z direction, an electrostatic chuck 9 which holds the wafer to be inspected 6, a sensor 11 which detects secondary electrons (or reflected electrons) 10 generated through irradiation with the primary electrons 2, an A/D converter 12 which converts a detection signal detected using the sensor 11 to a digital image signal, an image processor 13 which processes the digital image signal and judges defects, an overall control section 14 which internally stores the judged defect information and performs overall control and a console 15 which conveys a user's instructions to the overall control section 14.

An overview of an inspection of the wafer to be inspected 6 is as follows. That is, the primary electrons 2 are swept in the X direction by the deflector 3 and scanned in the Y direction by the XY stage 7 to thereby obtain a two-dimensional image of the wafer to be inspected 6, the detected image which is the two-dimensional image is converted to a digital signal and compared by the image processor 13 with a reference image which must have the same pattern, a region having a different pattern is detected and defects are thereby judged.

Figure 2:
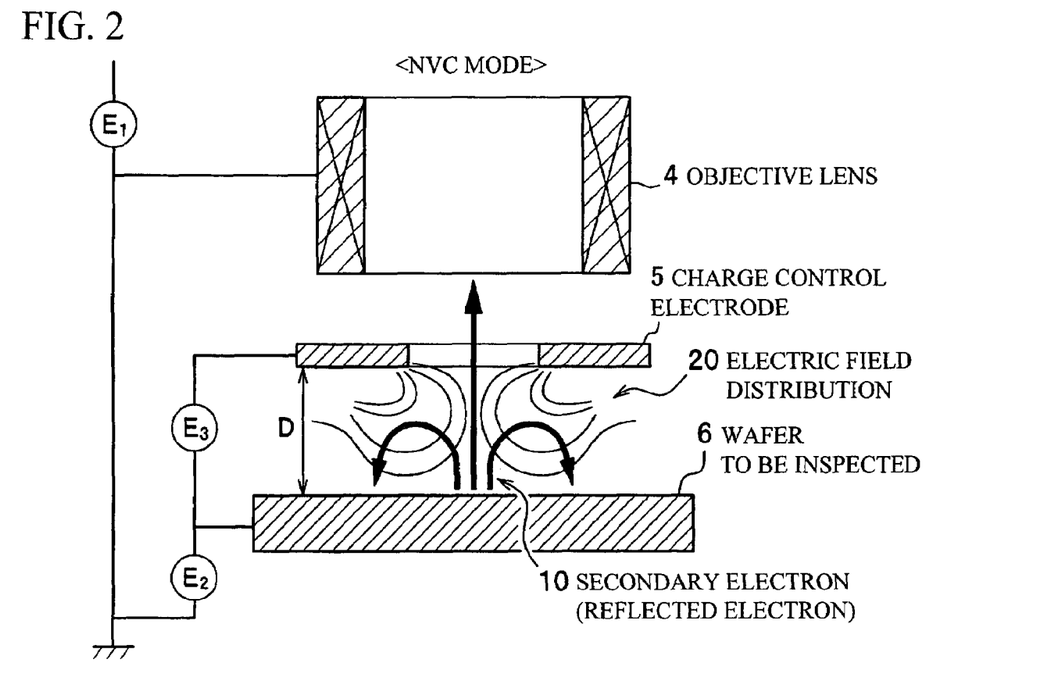
FIG. 2 illustrates operation in an NVC mode according to the present invention.

The setting of an NVC mode will be explained with reference to FIG. 2.

In the NVC mode, for example, $E_1=-10$ kV, $E_2=-9.5$ kV and $E_3=-0.2$ kV are set. This produces an electric field distribution 20 between the wafer to be inspected 6 and the charge control electrode 5. Compared to the wafer to be inspected 6, the charge control electrode 5 has relatively negative potential, and therefore some of the secondary electrons 10 generated from the wafer to be inspected 6 are affected by the electric field distribution 20 and returned to the wafer to be inspected 6. In this mode, optimal control of the electric field distribution 20 is a problem, and for this reason, it is important that a distance D between the wafer to be inspected 6 and the charge control electrode 5 be set to, for example, approximately 1 mm (that is, set to closer than in the PVC mode which will be described later) and be kept constant.

Figure 3:
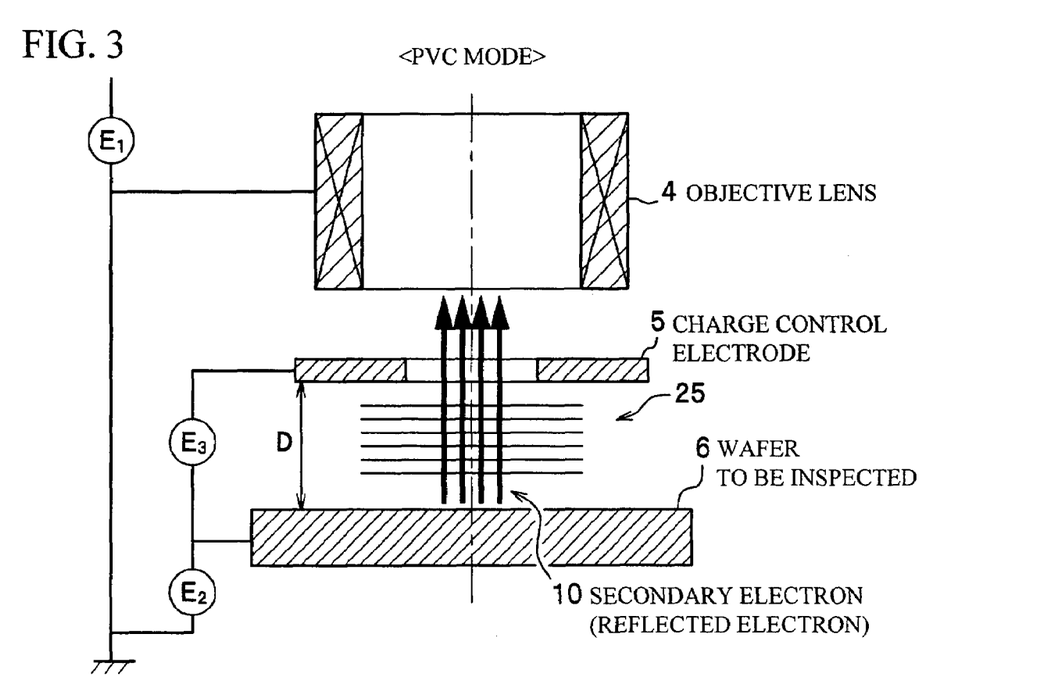
FIG. 3 illustrates operation in a PVC mode according to the present invention.

The setting of a PVC mode will be explained with reference to FIG. 3.

In the PVC mode, for example, $E_1=-10$ kV, $E_2=-9.5$ kV and $E_3=+12$ kV are set. This produces a strong electric field distribution 25 between the wafer to be inspected 6 and the charge control electrode 5. Since the charge control electrode 5 has relatively strong positive potential compared to the wafer to be inspected 6, the secondary electrons 10 generated are accelerated. In the PVC mode, increasing the intensity of the electric field distribution 25 is a problem, and therefore it is important that the distance D between the wafer to be inspected 6 and charge control electrode 5 be set to 3 mm, farther than in the NVC mode so as to prevent discharge due to disturbance of a local electric field of the wafer to be inspected 6 and the charge control electrode 5.

Returning to FIG. 1, the setting procedures of the NVC mode and the PVC mode will be explained.

When the PVC mode is set (see FIG. 1 and FIG. 3), the Z stage 8 is lowered, the distance D is set to 3 mm, the current value of the objective lens 4 is lowered and the focal length is thereby increased so that the wafer to be inspected 6 comes to an in-focus position. On the other hand, when the NVC mode is set (see FIG. 1, FIG. 2), the Z stage 8 is raised, the distance D is set to 1 mm, the current value of the objective lens 4 is increased so that the focal length is shortened and the wafer to be inspected 6 comes to an in-focus position. Furthermore, using the electrostatic chuck 9 flattens the warpage of the wafer to be inspected 6 and prevents the distance D from changing. In this way, the function of adjusting the distance D according to the detection scheme and the function of maintaining the distance D constant allow optimal detection conditions to be kept in both the NVC mode and the PVC mode.

Figure 4:
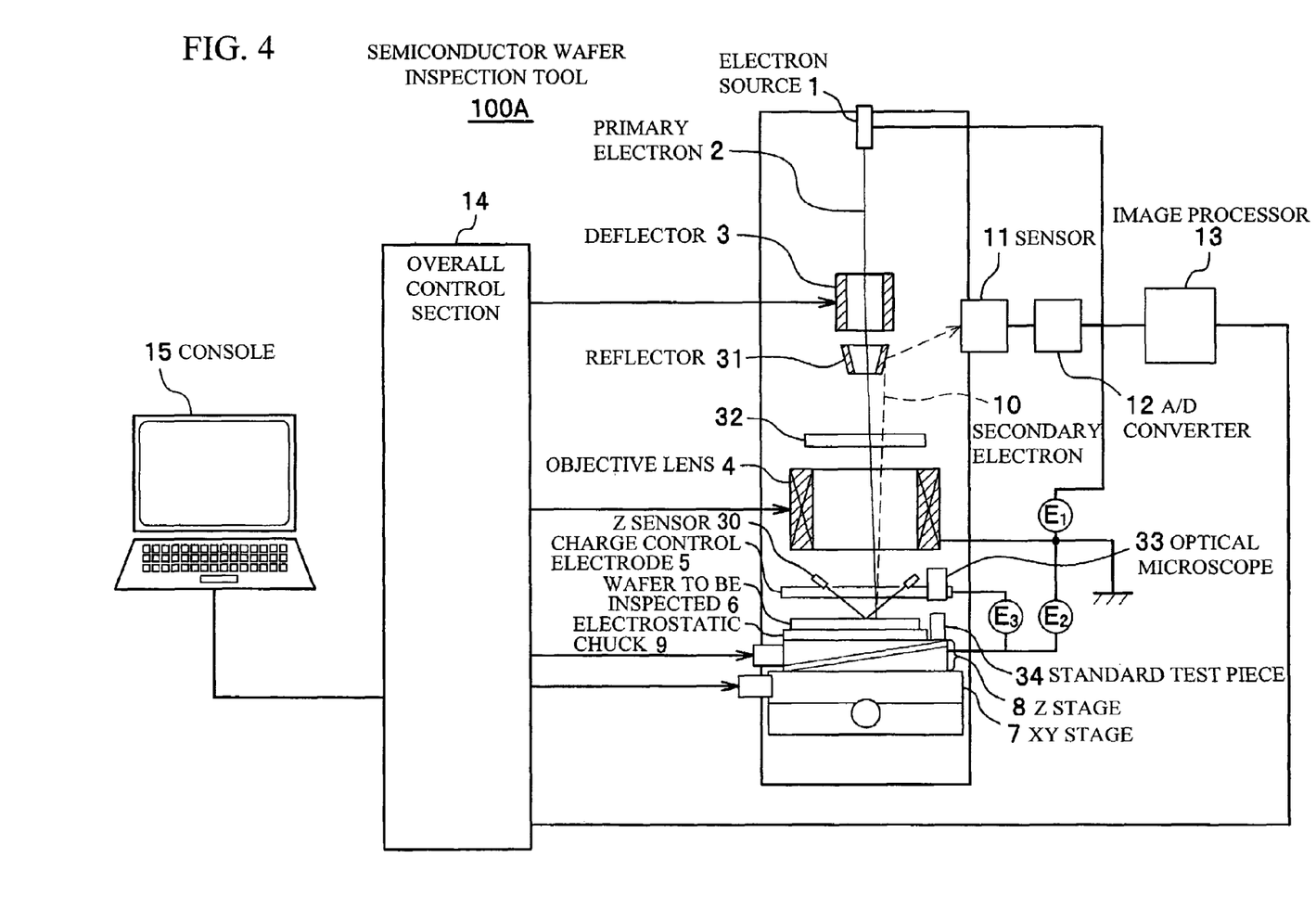
FIG. 4 is a configuration diagram of a semiconductor wafer inspection tool of a first embodiment according to the present invention.

FIG. 4 is a configuration diagram showing a semiconductor wafer inspection tool 100A of a first embodiment according to the present invention.

This semiconductor wafer inspection tool 100A is constructed of an electron source 1, a deflector 3 for deflecting primary electrons 2 from the electron source 1, an objective lens 4 which narrows down the primary electrons 2, a charge control electrode 5 which controls electric field intensity, an XY stage 7 which moves a wafer to be inspected 6 in the XY direction, a Z stage 8 which moves the wafer to be inspected 6 in the Z direction, an electrostatic chuck 9 which holds the wafer to be inspected 6, a Z sensor 30 which measures the height of the wafer to be inspected 6, a convergence optics 32 which causes secondary electrons (or reflected electrons) 10 generated through irradiation of the primary electrons 2 to converge on a reflector 31, the reflector 31 which receives the secondary electrons (or reflected electrons) 10 and generates secondary electrons 10 again, a sensor 11 which detects the secondary electrons 10 from the reflector 31, an A/D converter 12 which converts a signal detected by the sensor 11 to a digital signal, an image processor 13 which processes the digital signal and judges defects, an overall control section 14 which stores the judged defects and performs overall control, a console 15 which conveys a user's instructions to the overall control section 14, an optical microscope 33 which captures an optical image of the wafer to be inspected 6 and a standard test piece 34 set to the same height as the wafer to be inspected 6 for adjusting details of electronic/optical conditions.

To avoid the figure from becoming complicated, only some of control signal lines from the overall control section 14 will be described and other signal lines will be omitted, but the overall control section 14 is configured so as to be able to control sections related to the signal lines whose description is omitted. Furthermore, illustration and explanations of ExB for changing tracks of the primary electrons 2 from the electron source 1 and the secondary electrons (or reflected electrons) 10 generated on the wafer to be inspected 6 to bend the secondary electrons (or reflected electrons) 10 will be omitted to avoid complexity.

Figure 5:
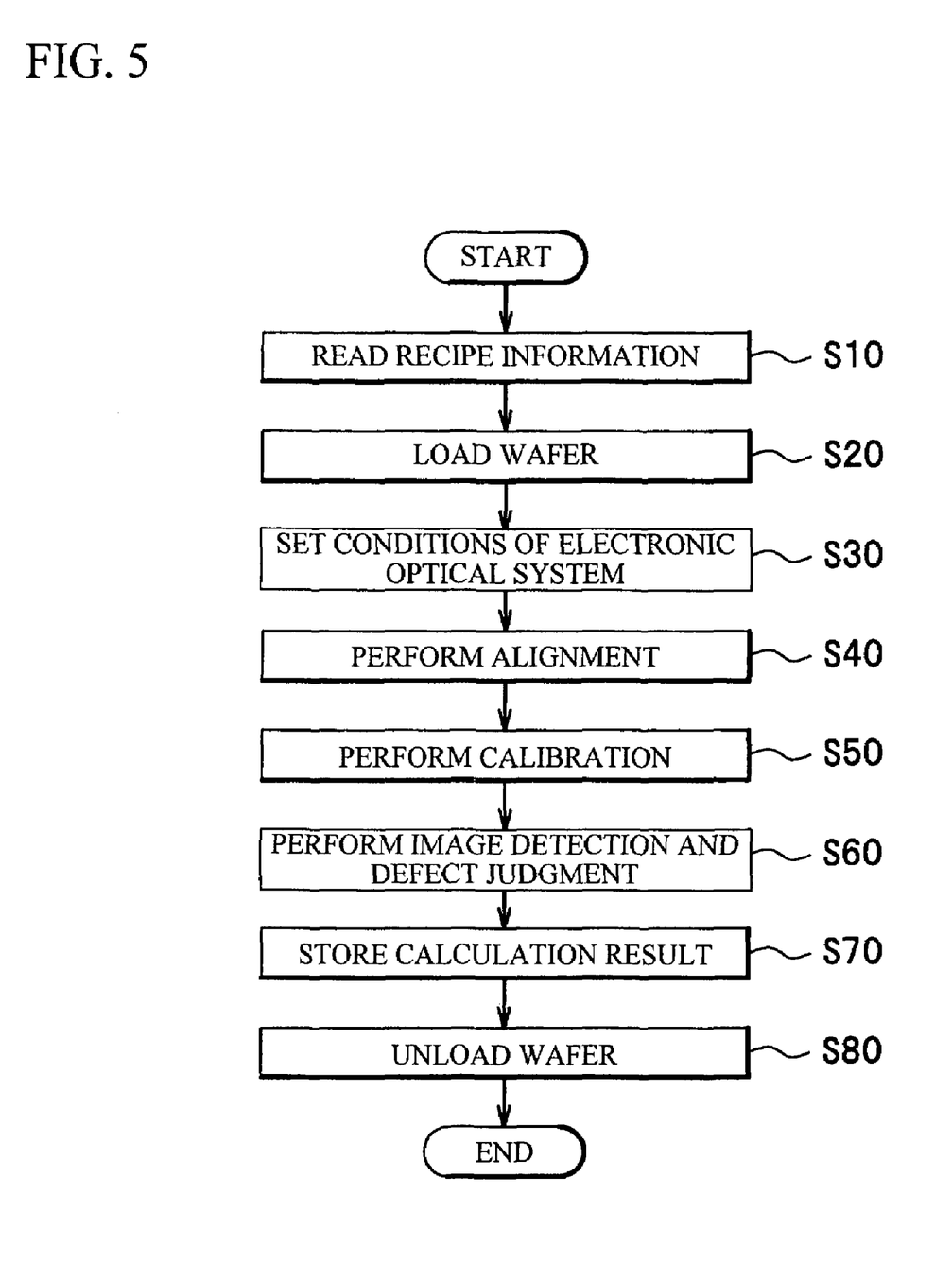
FIG. 5 is a flow chart showing an inspection procedure of the first embodiment according to the present invention.

An outlined procedure of inspection will be explained with reference to FIG. 5.

Recipe information describing the inspection method is read from a storage section (not shown) inside the overall control section 14 (step S10), the wafer to be inspected 6 is loaded (step S20), conditions of the electron optical system are set by adjusting the height of the stage to an optimal value according to the inspection method (step S30), alignment is performed to correct the measuring/coordinate systems to a pattern which is registered beforehand (step S40), calibration is carried out to adjust the amount of detected signals (step S50), the wafer to be inspected 6 is then sequentially scanned and image detection/defect decision are performed to process the detected image and detect defects (step S60), the defect information is described in an inspection result file (not shown) of the storage section of the overall control section 14 and the calculation result is thereby stored (step S70), the wafer to be inspected 6 is unloaded and stored in the original cassette (step S80), and the inspection is ended.

These steps will be explained in detail.

When the operator gives an instruction from the console 15, the wafer to be inspected 6 and the inspection method are determined and recipe information describing the inspection method according to the inspection method is read (step S10).

A loader (not shown) picks up the wafer to be inspected 6 from a wafer cassette (not shown), the rotation direction thereof is measured using a mechanical positioning mechanism such as a notch or orientation flat, the wafer containing positioning errors within the ranges of rotation and mechanical accuracy is mounted on the electrostatic chuck 9 and chucked when a voltage is applied to the electrostatic chuck 9 (step S20).

Next, the height of the Z stage 8 is set to a predetermined height based on the optical condition described in the recipe information according to whether the mode is NVC or PVC and each section of the electron optical system is adjusted (step S30). Especially, the voltage of the charge control electrode 5 is set to an optimal value, the amount of control current of the objective lens 4 is set according to the height of the Z stage 8 and the voltage of the charge control electrode 5 to thereby set the focal length and the convergence optics 32 is set so that the convergence of secondary electrons 10 becomes optimal according to these conditions.

After these settings are completed, the image of the standard test piece 34 is detected and adjustment items (adjustment locations are not shown) such as astigmatism and focus are automatically fine-tuned so that a most beautiful image can be detected (step S40).

Next, calibration is performed (step S50). More specifically, first of all, after the setting of these electronic/optical conditions and fine-tuning are completed, the XY stage 7 is moved so that the positioning pattern which is registered beforehand on the wafer to be inspected 6 comes to the center of the field of view of the optical microscope 33. An image is captured and an approximate position thereof is measured using the optical microscope 33 and the wafer is moved to the positioning pattern for the electronic microscope which is registered beforehand at the center of the field of view of the electron optical system based on the measurement position. Furthermore, the wafer to be inspected 6 is raster scanned using the deflector 3, the secondary electrons 10 generated at that moment are detected using the sensor 11 and then converted to a digital signal using the A/D converter 12. Based on this digital signal, the position of the pattern is measured using the image processor 13, the precise position of the pattern is measured and when the stage is moved, the coordinate system is corrected based on the measured pattern position.

Moreover, a plurality of predetermined calibration coordinates on the wafer to be inspected 6 are moved to the center of the field of view of the electron optical system, the wafer to be inspected 6 is raster scanned using the deflector 3, the secondary electrons 10 generated at that moment are detected using the sensor 11 and then converted to a digital signal using the A/D converter 12 and a histogram of the detected image is acquired using the image processor 13. The gain of the sensor 11 is adjusted based on the histogram and in this way detection at the optimum gain is possible when an image detection/defect decision operation is performed next time (step S50).

Next, primary electrons 2 are swept in the X direction using the deflector 3, the XY stage 7 is consecutively scanned in the Y direction to thereby obtain a signal of a stripe image which is a two-dimensional image corresponding to one column of the wafer to be inspected 6 in the Y direction. At this time, based on the measured height of the Z sensor 30, the height of the Z stage 8 is corrected so as to keep the height of the wafer to be inspected 6 constant. The image signal obtained in this way is converted to a digital signal using the A/D converter 12. The image processor 13 compares the two-dimensional image with a reference image that must have the same pattern as the detected image, detects different regions in the image and judges defects. As for the judged effects, the image processor 13 calculates central coordinates of the defects, the image-taking length in the X direction and Y direction, area, difference in shade, light quantity of defects, light quantity of the background, defect texture, background texture, defect image, reference image and defect information such as the defect region image indicating the defect region or the like (step S60).

The overall control section 14 stores the defect information which is the calculation result obtained by the image processor 13 (step S70).

Likewise, when consecutive scanning in the Y direction is completed, the XY stage 7 is moved stepwise in the X direction, another region is consecutively scanned in the Y direction and defect decisions are repeated in the like manner. In this way, the inspection of the inspection region described in the recipe is completed.

After inspection of the entire inspection region is completed and the defect information is stored in the overall control section 14, the wafer to be inspected 6 is unloaded into the original wafer cassette and the inspection operation is completed (step S70).

With the above described configuration and operation, the following effects are obtained.

(1) Since the height is adjusted using the Z stage 8, an image can be detected under the detection conditions appropriate for both the NVC mode and the PVC mode.

(2) Since the convergence optics 32 adjusts convergence of the secondary electrons 10, sufficient efficiency in capturing secondary electrons 10 can be secured.

(3) Since the Z sensor 30 and Z stage 8 keep the height of the wafer to be inspected 6 uniform, an inspection can be realized under appropriate detection conditions regardless of distortion of the wafer to be inspected 6.

Figure 6:
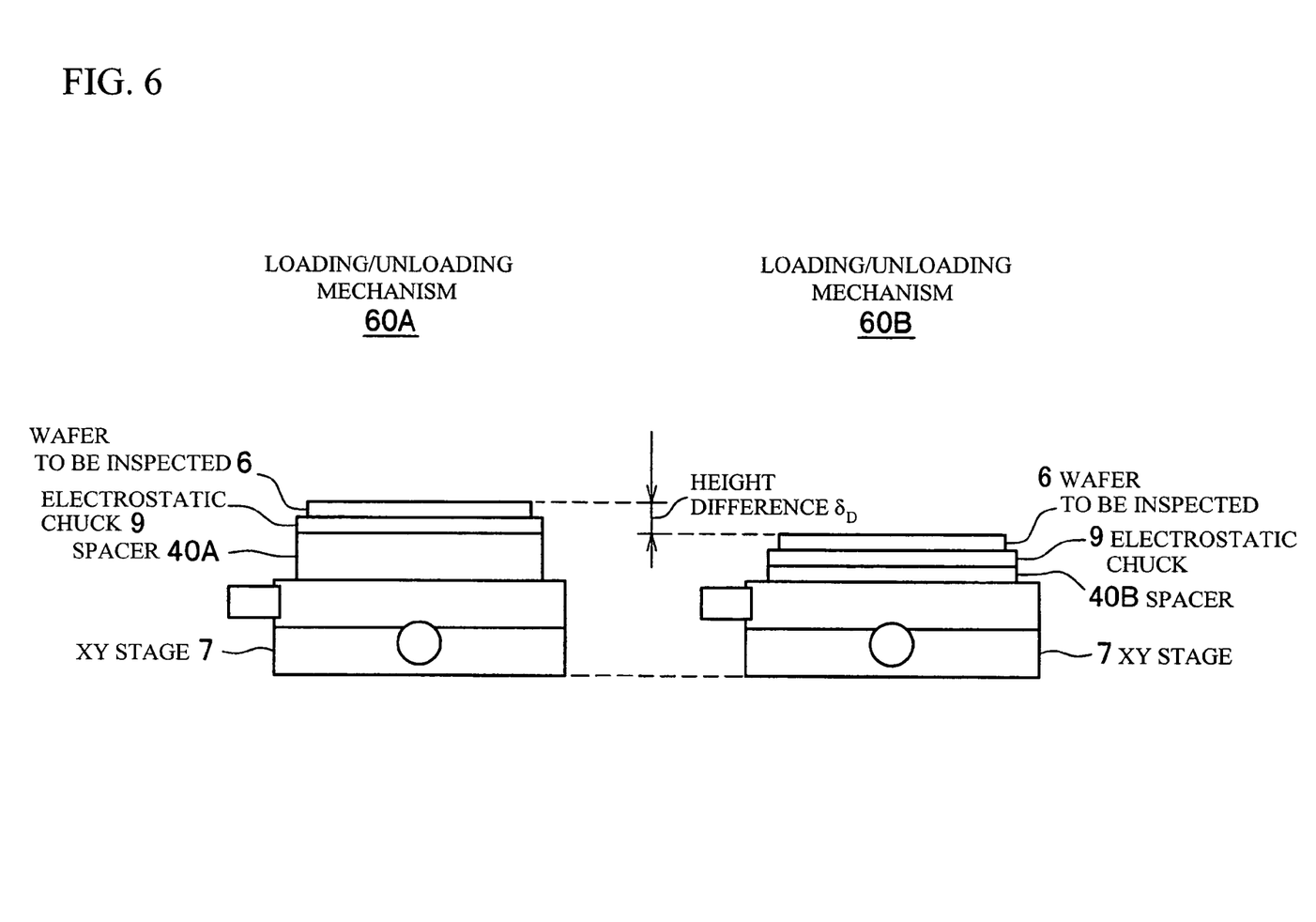
FIG. 6 is a partial configuration diagram of a semiconductor wafer inspection tool showing a first modification example of the first embodiment according to the present invention.

Next, a first modification example of the first embodiment according to the present invention will be explained with reference to FIG. 6.

This semiconductor wafer inspection tool (not shown) has a plurality of types of loading/unloading mechanisms 60A and 60B to load the wafer to be inspected 6. These loading/unloading mechanisms 60A and 60B have the electrostatic chuck 9 and spacers 40A and 40B of different heights. To use these loading/unloading mechanisms 60A and 60B, the electrostatic chuck 9 mounted with the wafer to be inspected 6 is placed on any one of the spacers 40A and 40B of different heights and this spacer 40A or 40B is loaded on the XY stage 7 for each electrostatic chuck 9 mounted with the wafer to be inspected 6.

The loading/unloading mechanism 60A which has the thick (length in the Z direction) spacer 40A and holds the wafer to be inspected 6 at a high position is suitable for use in the NVC mode, while the loading/unloading mechanism 60B which has the thin spacer 40B and holds the wafer to be inspected 6 at a low position is suitable for use in the PVC mode. As shown in FIG. 4, the overall control section 14 detects height information using the Z sensor 30 (see FIG. 4) and feeds back the height information to the excitation current value of the objective lens 4 to adjust the focal length of the objective lens 4 and realizes focusing on the surface of the wafer to be inspected 6.

The first modification example according to the first embodiment of the present invention can set the NVC mode and the PVC mode without the Z stage 8 (see FIG. 4) and realize appropriate detection conditions using a simpler mechanism.

Figure 7:
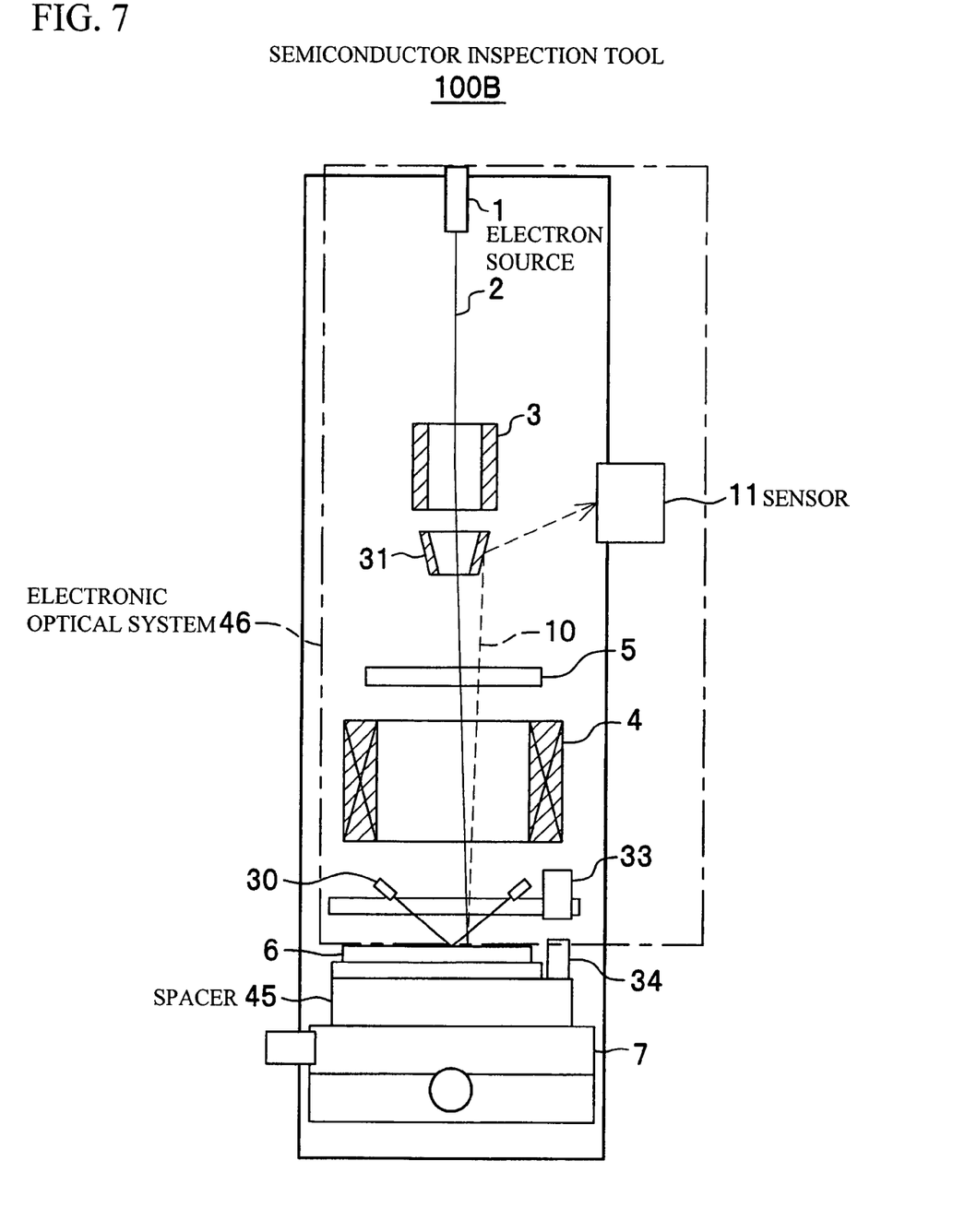
FIG. 7 is a partial configuration diagram of a semiconductor wafer inspection tool showing a second modification example of the first embodiment according to the present invention.

Next, a second modification example of the first embodiment according to the present invention will be explained with reference to FIG. 7.

This semiconductor wafer inspection tool 100B has a configuration corresponding to the semiconductor wafer inspection tool 100 (see FIG. 4) according to the first embodiment provided with a spacer 45 instead of the Z stage 8, wherein an electron optical system 46 is mounted on a Z drive mechanism and the overall height of the electron optical system 46 is made adjustable according to whether the inspection condition is in an NVC mode or PVC mode. An overall control section 14 detects height information on a wafer to be inspected 6 using a Z sensor 30 and controls an excitation current of an objective lens 4 through feedback and adjusts the focal length of the objective lens 4. This makes it possible to make a setting under conditions in any one of the NVC mode and the PVC mode without the Z stage 8 (see FIG. 4) and realize inspections under optimal detection conditions corresponding to each mode.

Figure 8:
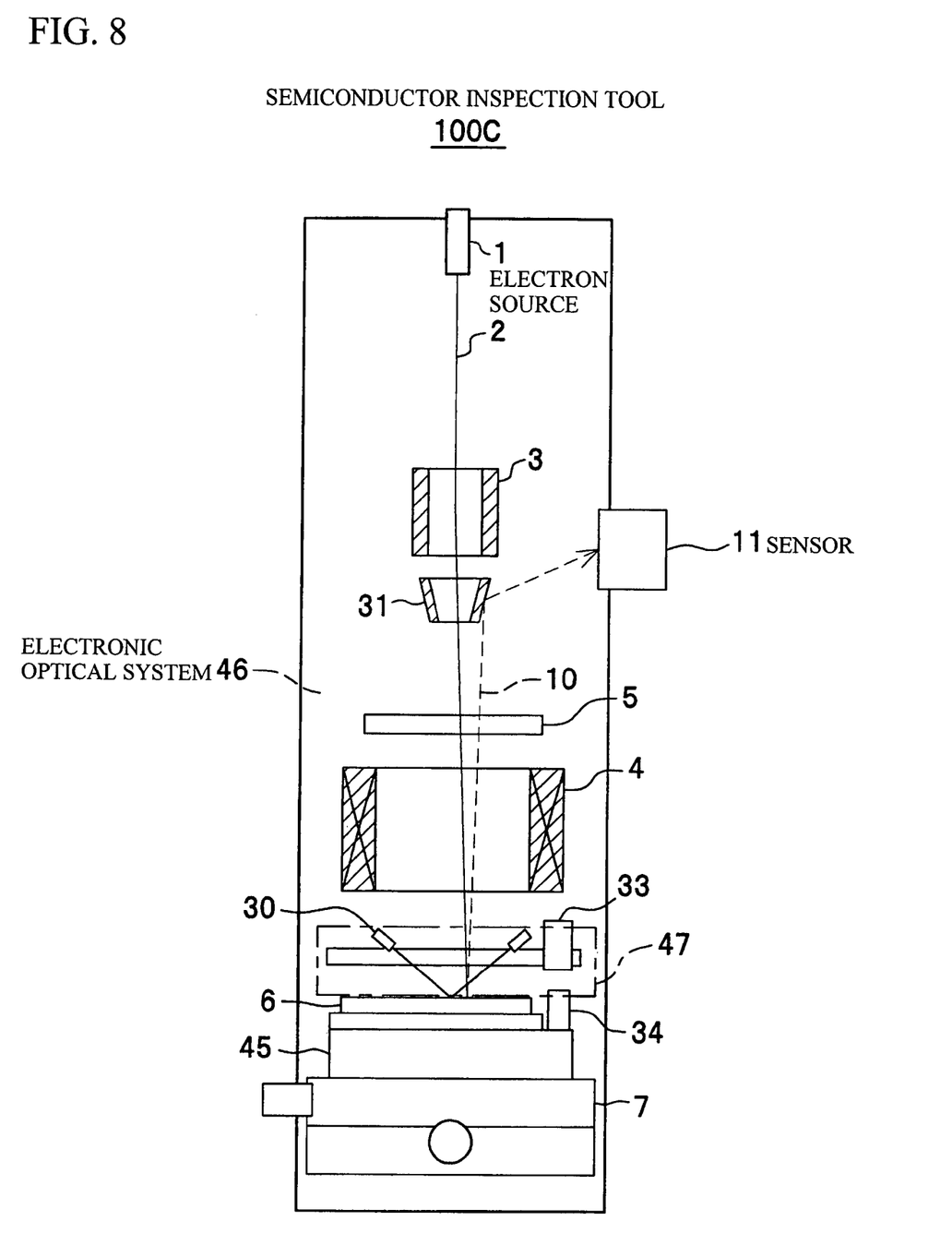
FIG. 8 is a partial configuration diagram of a semiconductor wafer inspection tool showing a third modification example of the first embodiment according to the present invention.

Next, a third modification example of the first embodiment according to the present invention will be explained with reference to FIG. 8.

This semiconductor wafer inspection tool 100C has a configuration corresponding to the semiconductor wafer inspection tool 100 according to the first embodiment (see FIG. 4) provided with a spacer 45 instead of the Z stage 8, wherein a charge control electrode section 47 of a charge control electrode 5 is mounted on a Z drive mechanism and the height of the charge control electrode section 47 is adjusted according to whether an inspection condition is an NVC mode or PVC mode. An overall control section 14 detects height information on a wafer to be inspected 6 using a Z sensor 30, controls an excitation current of an objective lens 4 through feedback and adjusts the focal length of the objective lens 4. This makes it possible to make a setting under conditions in any one of the NVC mode and the PVC mode without the Z stage 8 (see FIG. 4) and realize inspections under optimal detection conditions corresponding to each mode.

Next, a fourth modification example of the first embodiment according to the present invention will be explained.

To detect the height of a wafer to be inspected 6, this embodiment measures the height in real time during an inspection using a Z sensor 30, and prior to this inspection, this embodiment gradually changes the excitation current of the objective lens 4 or the height of a Z stage 8, captures a plurality of images of different heights and determines an optimal height from the plurality of images beforehand. Similar measurement is performed at a plurality of appropriate positions in the XY direction on the semiconductor wafer 6. In this way, by collecting the height information beforehand, this embodiment can correct the height according to the height information measured beforehand without measuring the height in real time during an inspection. This makes it possible to make a setting under conditions in any one of the NVC mode and the PVC mode without the Z sensor 30 (see FIG. 4) and realize inspections under optimal detection conditions corresponding to each mode.

Next, a second embodiment of the inspection method and the inspection tool according to the present invention will be explained in detail with reference to the drawings.

Figure 9:
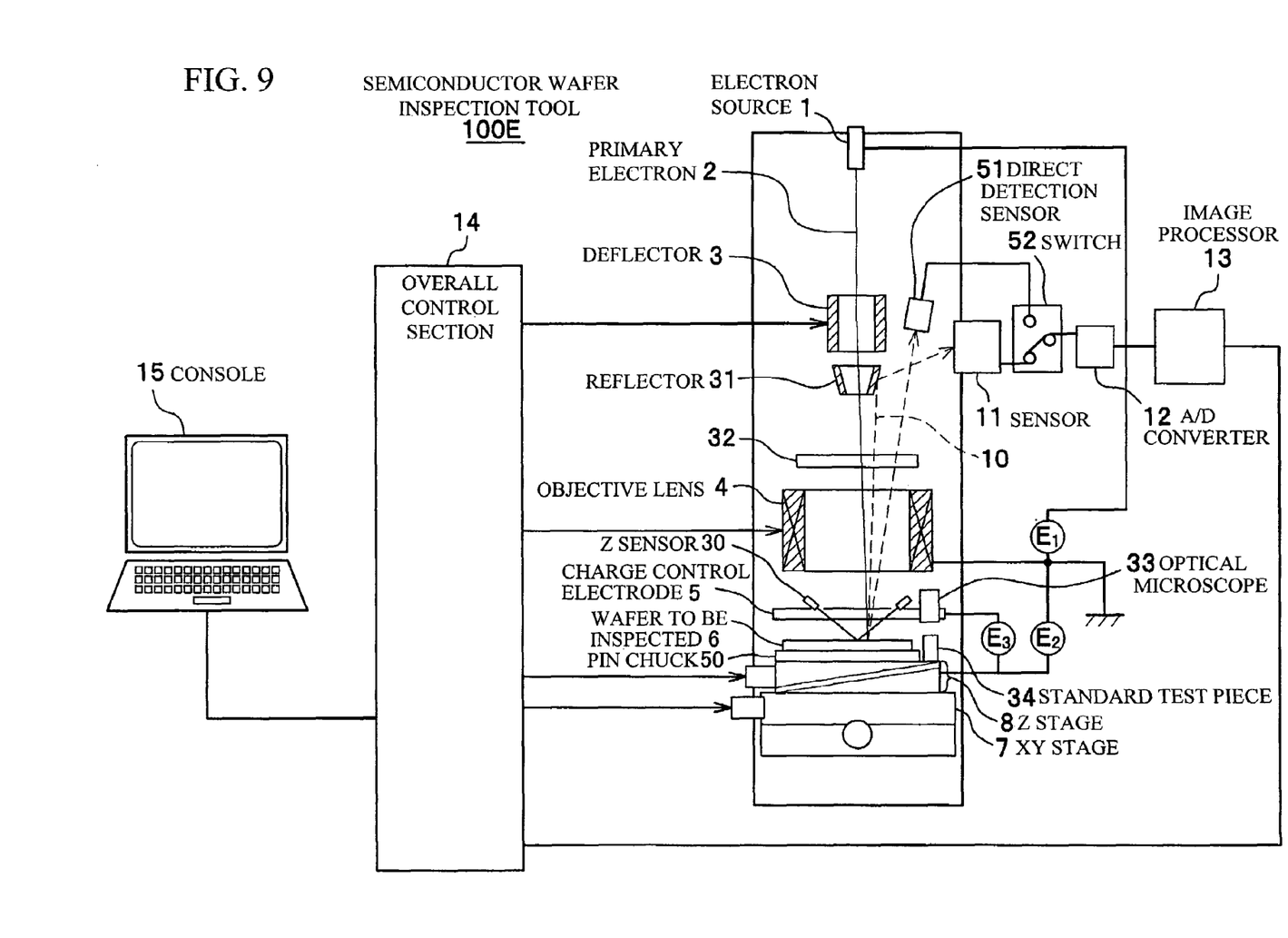
FIG. 9 is a configuration diagram of a semiconductor wafer inspection tool of a second embodiment according to the present invention.

FIG. 9 shows the configuration of a semiconductor wafer inspection tool 100E of the second embodiment according to the present invention.

This semiconductor wafer inspection tool 100E is provided with an electron source 1, a deflector 3 to deflect primary electrons 2 from the electron source 1, an objective lens 4 which narrows down the primary electrons 2, a charge control electrode 5 which controls electric field intensity, an XY stage 7 which moves a wafer to be inspected 6 in an XY direction, a Z stage 8 which moves the wafer to be inspected 6 in a Z direction, a pin chuck 50 which holds the wafer to be inspected 6, a Z sensor 30 which measures the height of the wafer to be inspected 6, a convergence optics 32 which causes secondary electrons (or reflected electrons) 10 generated through irradiation of the primary electrons 2 to converge on a reflector 31, the reflector 31 which receives the secondary electrons (or reflected electrons) 10 and causes the secondary electrons 10 to be generated again, a sensor 11 which detects the secondary electrons 10 from the reflector 31, a direct detection sensor 51 which directly detects the secondary electrons (or reflected electrons) 10 without the medium of the reflector 31, a switch 52 which switches between signals from the sensor 11 and the direct detection sensor 51, an A/D converter 12 which converts the signal detected by the sensor 11 or the direct detection sensor 51 to a digital signal, an image processor 13 which processes the digital signal and judges defects, an overall control section 14 which stores the judged defects and performs overall control, a console 15 which conveys a user's instructions to the overall control section 14, an optical microscope 33 which captures an optical image of the wafer to be inspected 6 and a standard test piece 34 to adjust details of electronic/optical conditions set to the same height as that of the wafer to be inspected 6.

To avoid the figure from becoming complicated, only some of control signal lines from the overall control section 14, will be described and other signal lines will be omitted, but the overall control section 14 is configured so as to be able to control sections related to the signal lines whose description is omitted. Furthermore, illustration and explanations of E×B for changing tracks of the primary electrons 2 from the electron source 1 and the secondary electrons (or reflected electrons) 10 generated on the wafer to be inspected 6 to bend the secondary electrons (or reflected electrons) 10 will be omitted to avoid complexity.

Since an outlined procedure of inspection is the same as that in the first embodiment, drawings and explanations will be omitted and only differences in the operation will be explained in detail.

This embodiment uses the pin chuck 50 instead of the electrostatic chuck 9. Since the degree of flatness of the wafer to be inspected 6 is not good, a variation in the height is relatively large and the frequency with which the height is detected using the Z sensor 30 or the like needs to be increased, but the basic operation is the same as that in the first embodiment. Furthermore, both the sensor 11 and the direct detection sensor 51 are arranged to detect the secondary electrons (or reflected electrons) 10. The direct detection sensor 51 is used in the case of detection conditions under which the secondary electrons (or reflected electrons) 10 can be made to converge to a small spot directly on the direct detection sensor 51 through the convergence optics 32. However, when the secondary electrons 10 cannot be made to converge to a sufficiently small spot, the secondary electrons (or reflected electrons) 10 are irradiated onto the reflector 31 once and the switch 52 is switched so that the sensor 11 detects the secondary electrons 10 generated on the reflector 31.

According to this embodiment, an inspection tool can be constructed without using the expensive electrostatic chuck 9 and when a direct detection is possible, a detection is performed using the direct detection sensor 51 and it is thereby possible to perform an image detection at a better signal-to-noise ratio (SNR). Furthermore, since the height is adjusted using the Z stage 8, images can be detected under detection conditions appropriate for both conditions in the NVC mode and the PVC mode. Furthermore, since the height of the wafer to be inspected 6 is kept uniform using the Z sensor 30 and Z stage 8, an inspection can be realized under optimal detection conditions.

As described above, according to the present invention, it is possible to provide a semiconductor wafer inspection tool and a semiconductor wafer inspection method capable of setting optimal detection conditions for both an NVC mode and a PVC mode using the single inspection tool and handling many processes and defects.

What is claimed is:
1. A semiconductor wafer inspection tool comprising:
an electron source which emits primary electrons;
an irradiation optical system which irradiates the primary electrons from the electron source onto an object;
a scanning section which scans irradiation positions of the primary electrons in an X direction and in a Y direction;

a charge control electrode which for generating an electric field distribution to charge the objective positively or negatively;

a sensor which detects the secondary electrons or the reflected electrons through the charge control electrode and outputs a detection signal;

an image processor which converts the detection signal from the sensor to a detected image, compares the detected image with a predetermined reference image and judges defects;

an overall control section which sets a voltage to be applied to the charge control electrode according to an inspection condition selected from recipe information describing a plurality of inspection conditions for each object; and a distance controller configured to adjust a distance between the object and the charge control electrode depending on mode type of positively charging the object and negatively charging the object.

2. The semiconductor wafer inspection tool according to claim 1, wherein the object is held by an electrostatic chuck.

3. The semiconductor wafer inspection tool according to claim 1, further comprising height measuring means for measuring the height of the object and acquiring height information of the object, wherein the distance controller is a Z stage mechanism configured to adjust the distance based on the measured height information.

4. The semiconductor wafer inspection tool according to claim 3, wherein the height measuring means includes a Z sensor.

5. The semiconductor wafer inspection tool according to claim 1, further comprising height measuring means for measuring the height of the object and acquiring height information of the object, wherein the distance controller is an electron optical system setting means for adjusting at least one of heights of the electron source, the irradiation optical system, the scanning section and the charge control electrode based on the height information.

6. The semiconductor wafer inspection tool according to claim 5, wherein the height measuring means includes a Z sensor.

7. The semiconductor wafer inspection tool according to claim 1, further comprising a Z sensor as voltage setting means or height measuring means of the charge control electrode.

8. A semiconductor wafer inspection method using an inspection apparatus, comprising:

selecting recipe information indicating inspection conditions including type of PVC mode in which an object is positively charged and NVC mode in which the object is negatively charged;

adjusting a distance between a charge control electrode and the object depending on said PVC mode and said NVC mode;

determining operation conditions of each section of the inspection apparatus based on the selected recipe information;

irradiating primary electrons from an electron source onto the object while scanning the primary electrons in one direction under the operation conditions, moving the object in a direction different from at least the scanning direction and controlling the secondary electrons or reflected electrons emitted from the object through irradiation of the primary electrons using the charge control electrode;

detecting the secondary electrons or the reflected electrons controlled by the charge control electrode using a sensor and converting the electrons to a detected image; and comparing the detected image with a predetermined reference image and judging defects.

9. The semiconductor wafer inspection method according to claim 8, wherein when a detected image is acquired, the distance between the charge control electrode and the object is measured beforehand or in real time, and the distance is adjusted based on the measurement result.

10. An inspection apparatus for irradiating an object to be inspected with a primary electron beam and inspecting the object using secondary electrons or reflected electrons generated by the irradiation of the primary electron beam comprising:

an electron optical system functioning PVC mode in which the object is positively charged and NVC mode in which the object is negatively charged;

said electron optical system is including a charge control electrode that controls the secondary electrons or reflected electrons emitted from the object;

a XY stage that moves the object in XY direction; and a distance controller configured to adjust a distance between the object and the charge control electrode depending on said PVC mode and said NYC mode.

11. An inspection apparatus according to claim 10, wherein said distance controller comprises:

a Z stage that moves the object in a Z direction; and a control section that determines a distance between the charge control electrode and the object depending on the PVC mode and the NVC mode, and controls the Z stage.

12. An inspection apparatus according to claim 10, wherein said distance controller means comprises:

a first spacer and a second spacer configured to be inserted between the object and the XY stage depending on the PVC mode and NYC mode.

* * * * *